United States Patent [19]

Arase

[11] Patent Number: 5,663,904
[45] Date of Patent: Sep. 2, 1997

[54] FERROELECTRIC MEMORY USING PAIR OF REFERENCE CELLS

[75] Inventor: Kenshiro Arase, Kanagawa, Japan

[73] Assignee: Sony Corporation, Japan

[21] Appl. No.: 661,782

[22] Filed: Jun. 13, 1996

[30] Foreign Application Priority Data

Jun. 20, 1995 [JP] Japan .................................. 7-153554

[51] Int. Cl.$^6$ ................................................... G11C 11/22
[52] U.S. Cl. ........................... 365/145; 365/149; 365/210
[58] Field of Search ............................. 365/145, 149, 365/189.01, 205, 208, 210

[56] References Cited

U.S. PATENT DOCUMENTS

| 5,010,518 | 4/1991 | Toda | 365/145 |
| 5,455,786 | 10/1995 | Takeuchi | 365/145 |
| 5,517,445 | 5/1996 | Imai | 365/145 |

Primary Examiner—David C. Nelms
Assistant Examiner—Son Mai
Attorney, Agent, or Firm—Ronald P. Kananen

[57] ABSTRACT

A ferroelectric memory comprised of a word line; a read bit line; a plate line; a memory array comprised of a matrix arrangement of memory cells with gate electrodes connected to the word line, one of the source-drain electrodes connected to the read bit line, the other of the source-drain electrodes connected to one of the electrodes of a ferroelectric capacitor, and the other of the electrodes of the ferroelectric capacitor connected to the plate line; a first reference cell and a second reference cell corresponding to each of the read cells in a word line selected at the time of reading data, read out in comparison with each other, and storing data different in value from each other; a first sense amplifier for comparing and amplifying a difference in potential between the read bit line and a first reference bit line to which the first reference cell is connected for each read bit line to which a read cell is connected; and a second sense amplifier for comparing and amplifying a difference in potential between the read bit line and a second reference bit line to which the second reference cell is connected.

10 Claims, 11 Drawing Sheets

FIG. 7

| READ CELLS | | MA | MA' | MB | MB' |
|---|---|---|---|---|---|
| SELECTION SIGNALS | S1 | H | H | L | H |
| | S2 | H | H | H | L |
| | S3 | H | L | H | L |
| | S4 | L | H | L | H |
| | S5 | L | H | H | H |
| | S6 | H | L | H | H |
| SA1 | N1 | MA | RMA(1) | MB | RMA(1) |
| | N2 | RMA'(0) | MA' | RMA'(0) | MB' |
| SA2 | N3 | MA | RMB(0) | MB | RMB(0) |
| | N4 | RMB'(1) | MA' | RMB'(1) | MB' |

FIG. 8A  φPC

FIG. 8B  BLA (N1,N3)

FIG. 8C  BLA' (N2)

FIG. 8D  BLB' (N4)

FIG. 8E  φSE

FIG. 8F  WLA

FIG. 8G  RWLA' (RWLB')

FIG. 8H  PLA

FIG. 8I  RPLA (RPLB)

| READ CELLS | | MA | MA' | MB | MB' |
|---|---|---|---|---|---|
| SELECTION SIGNALS | S1 | H | L | H | H |
| | S2 | L | H | H | H |
| | S3 | H | H | L | L |
| | S4 | L | L | H | H |
| | S5 | H | H | H | L |
| | S6 | H | H | L | H |
| SA1 | N1 | MA | MA' | RMA(1) | RMA(1) |
| | N2 | RMB(0) | RMB(0) | MB | MB' |
| SA2 | N3 | MA | MA' | RMA'(0) | RMA'(0) |
| | N4 | RMB'(1) | RMB'(1) | MB | MB' |

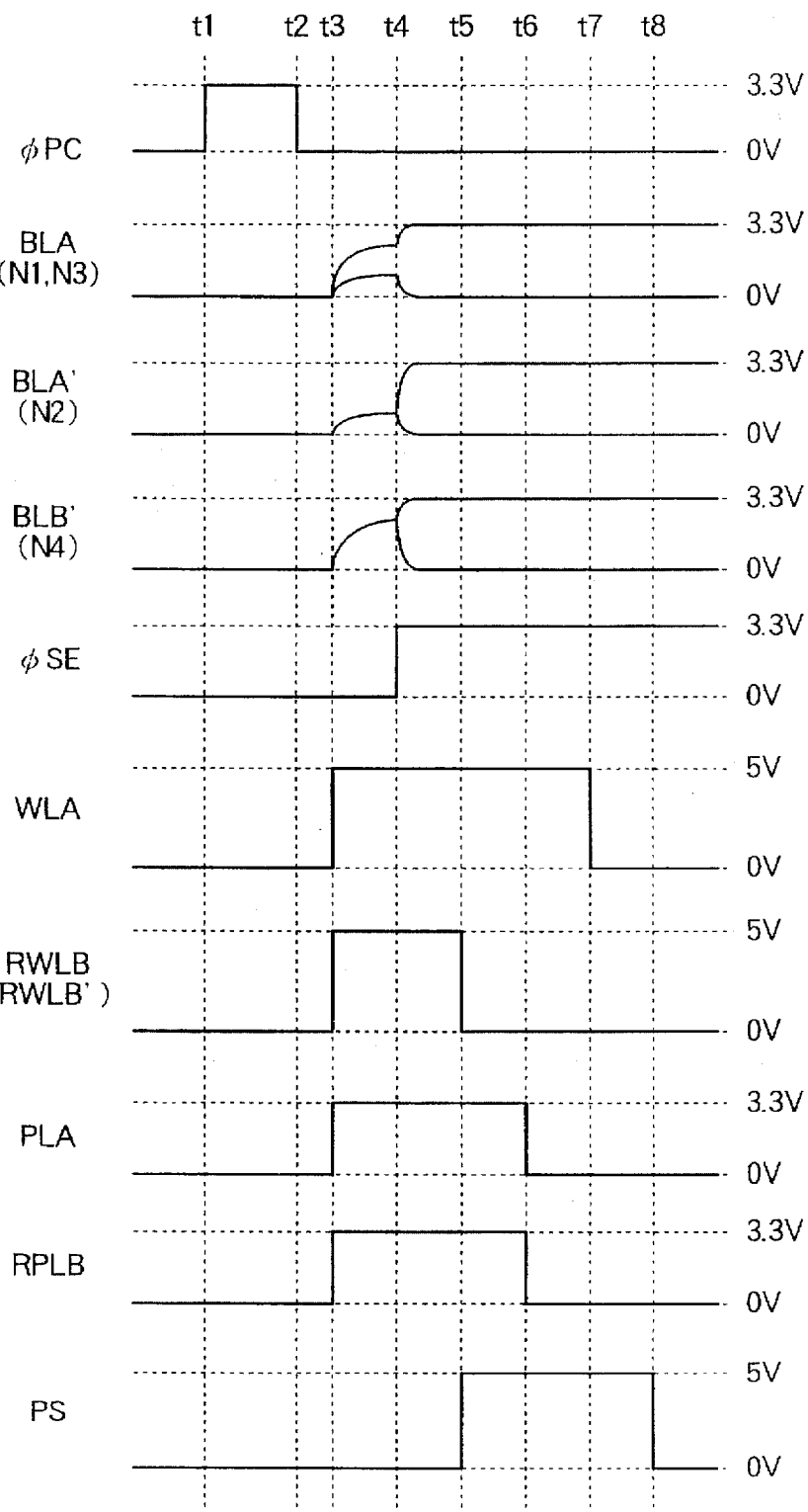

FERROELECTRIC MEMORY USING PAIR OF REFERENCE CELLS

BACKGROUND OF THE INVENTION

1. Field of the Invention

The present invention relates to a ferroelectric memory including memory cells each comprised of a single selection transistor and a single ferroelectric capacitor and storing data by the direction of polarization of the ferroelectric capacitors.

2. Description of the Related Art

There is known a ferroelectric memory comprising memory cells including ferroelectric capacitors using as a capacitor insulating film a ferroelectric material of an oxide of a perovskite structure such as $BaTiO_3$, $SrTiO_3$, or $PbTiO_3$ and storing data by the direction of polarization Of the ferroelectric capacitors.

When forming a memory cell of such a ferroelectric memory by a single transistor and single capacitor, however, the difference in potential between the read bit line connected to the memory cell and the reference bit line connected to the reference cell is small, so it is not easy to ensure a sufficient margin needed for the read operation. On the other hand, when forming a memory cell by two transistors and two capacitors, it becomes easy to secure a sufficient margin required for the read operation, but the memory cell becomes larger in area—which is disadvantageous when trying to construct a large capacity memory.

SUMMARY OF THE INVENTION

An object of the present invention is to provide a ferroelectric memory with which a sufficient margin required for a read operation can be secured and in turn with which a higher reliability and greater capacity can be realized.

To achieve the above object, the present invention provides a ferroelectric memory comprised of a word line; a read bit line; a plate line; a memory array comprised of a matrix arrangement of memory cells with gate electrodes connected to the word line, one of the source-drain electrodes connected to the read bit line, the other of the source-drain electrodes connected to one of the electrodes of a ferroelectric capacitor, and the other of the electrodes of the ferroelectric capacitor connected to the plate line; a first reference cell and a second reference cell corresponding to each of the read cells in a word line selected at the time of reading data, read out in comparison with each other, and storing data different in value from each other; a first sense amplifier for comparing and amplifying a difference in potential between the read bit line and a first reference bit line to which the first reference cell is connected for each read bit line to which a read cell is connected; and a second sense amplifier for comparing and amplifying a difference in potential between the read bit line and a second reference bit line to which the second reference cell is connected.

Preferably, the ferroelectric memory, at the time of reading data, simultaneously and in parallel reads the data of the read cell to the read bit line, the data of the first reference cell to the first reference bit line, and the data of the second reference cell to the second reference bit line, the data of the read cell is read as a result of the comparison and amplification of the first sense amplifier when the data of the read cell is different from the data of the first reference cell and the same as the data of the second reference cell, and the data of the read cell is read as a result of the comparison and amplification of the second sense amplifier when the data of the read cell is the same as the data of the first reference cell and different from the data of the second reference cell.

Preferably, the ferroelectric memory has a pair of memory arrays forming folded bit line constructions provided with one of the first or second reference cells for each bit line, the pair of memory arrays being arranged in opposite directions across the first sense amplifier and the second sense amplifier and, at the time of reading data, one of the memory arrays of the pair of memory arrays being selected for reading the data of the read cell.

Preferably, the read bit line is the bit line to which the read cell of the selected memory array is connected, the first reference bit line and the first reference cell are the bit line adjoining the read bit line in the folded back direction and the reference cell connected to that bit line, and the second reference bit line and second reference cell are the bit line arranged opposite to the direction in which the first reference bit line extends and the reference cell connected to that bit line in the non-selected memory array.

Preferably, the read bit line is the bit line to which the read cell of the selected memory array is connected, the first reference bit line and the first reference cell are the bit line arranged opposite to the direction in which the read bit line extends and the reference cell connected to that bit line in the non-selected memory array, and the second reference bit line and second reference cell are the bit line adjoining the first reference bit line in the folded back direction and the reference cell connected to that bit line.

Preferably, the first sense amplifier and the second sense amplifier are latch type sense amplifiers which compare and amplify the difference in potential between the read bit line and the first reference bit line or the second reference bit line.

Preferably, the first reference cell and the second reference cell each have one selection transistor connected to the word line and bit line, one ferroelectric capacitor with one electrode connected to the selection transistor, and a connecting means for connecting the node between the ferroelectric capacitor and the selection transistor to a predetermined first potential or second potential.

Preferably, before the data is read, the first reference cell is connected to the first potential to write the desired data in the first reference cell and the second reference cell is connected to the second potential to write the desired data in the second reference cell.

Preferably, the memory cell and the reference cell are the same in size.

Preferably, the ferroelectric memory can operate selectively in either of the DRAM mode or the ferroelectric mode and in the DRAM mode, the data is judged in accordance with the charge accumulation of the ferroelectric capacitor of the memory cell.

BRIEF DESCRIPTION OF THE DRAWINGS

These and other objects and features of the present invention will become more apparent from the following description of the preferred embodiments given with reference to the attached drawings, in which:

FIG. 7 is a view of which bit lines are connected to the input and output nodes of the sense amplifier at the time of a read operation in the first embodiment shown in FIG. 5;

FIG. 11 is a view of which bit lines are connected to the input and output nodes of the sense amplifier at the time of a read operation in the second embodiment shown in FIG. 10; and FIGS. 12A to 12J are timing charts for explaining a read operation in the second embodiment shown in FIG. 10.

DESCRIPTION OF THE PREFERRED EMBODIMENTS

Before describing the preferred embodiments of the present invention, background arts and related arts will be described to facilitate understanding the features of the present invention.

Figure 1:
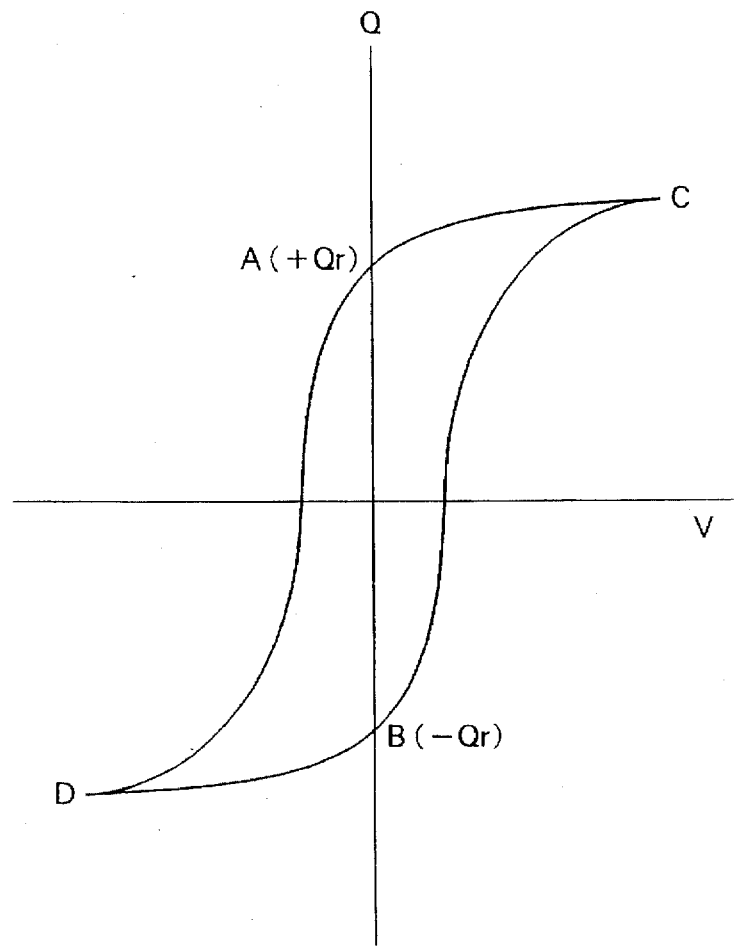
FIG. 1 is a graph of the hysteresis characteristic of a ferroelectric capacitor.
Figure 2A:
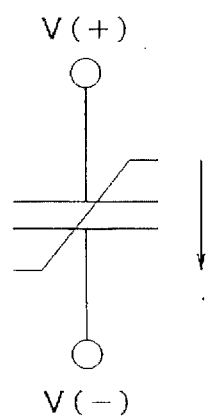
FIG. 2A and FIG. 2B are views of the state of writing of first data and second data having different values.
Figure 2B:
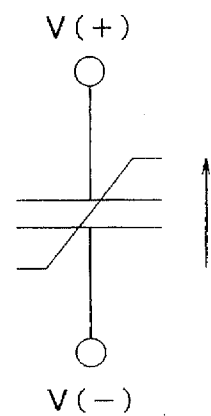

The hysteresis characteristic of a ferroelectric capacitor will first be explained with reference to FIG. 1 and FIGS. 2A and 2B. FIG. 1 is a graph showing the hysteresis characteristic of the relationship between the voltage V and the charge Q of the ferroelectric capacitor. FIGS. 2A and 2B are views showing the states of a capacitor in which are written first data (hereinafter referred to as the "data 1") and second data (hereinafter referred to as the "data 0") of different values from each other.

The ferroelectric memory is utilized as a nonvolatile memory with the state where a plus voltage is supplied to the ferroelectric capacitor (C in the figure) and a +Qr residual polarization charge remains (A in the figure) is used as the data 1 (first data) in the hysteresis characteristic shown in FIG. 1 and the state where a minus voltage is supplied (D in the figure) and a −Qr residual polarization charge remains (B in the figure) is used as the data 0 (second data).

Figure 3:
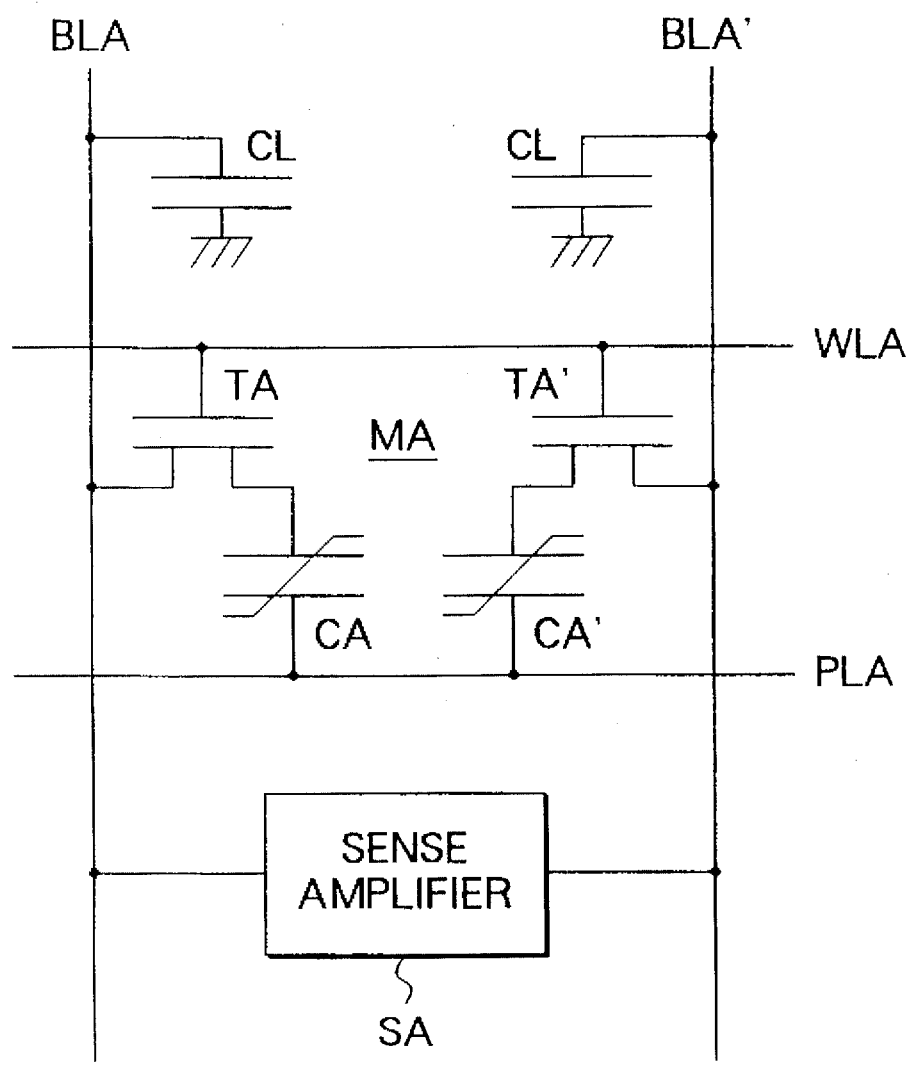
FIG. 3 is a view of the basic configuration of a memory array of a ferroelectric memory comprised by two-transistor, two-capacitor (2TR-2CAP) type cells.

To use a ferroelectric capacitor having the hysteresis characteristic shown in FIG. 1 as part of a nonvolatile ferroelectric memory, it is known to construct a memory cell from two selection transistors and two ferroelectric capacitors (2TR-2CAP type cell) and to construct a memory cell from one selection transistor and one ferroelectric capacitor (1TR-1CAP type cell). FIG. 3 is a circuit diagram of the basic configuration of a memory array of a ferroelectric memory having 2TR-2CAP type cells. In FIG. 3, MA denotes a memory cell, WLA denotes a word line, BLA and BLA' denote bit lines, and PLA denotes a plate line.

The memory cell MA is comprised of two selection transistors TA and TA' and two ferroelectric capacitors CA and CA'. Note that in FIG. 3, CL shows the load capacitances of the bit lines BLA and BLA'.

In the ferroelectric memory having 2TR-2CAP type cells of FIG. 3, data is stored in the two ferroelectric capacitors CA and CA' of the memory cell MA so that the capacitors CA and CA' become opposite in direction of polarization and different in value.

Figure 4:
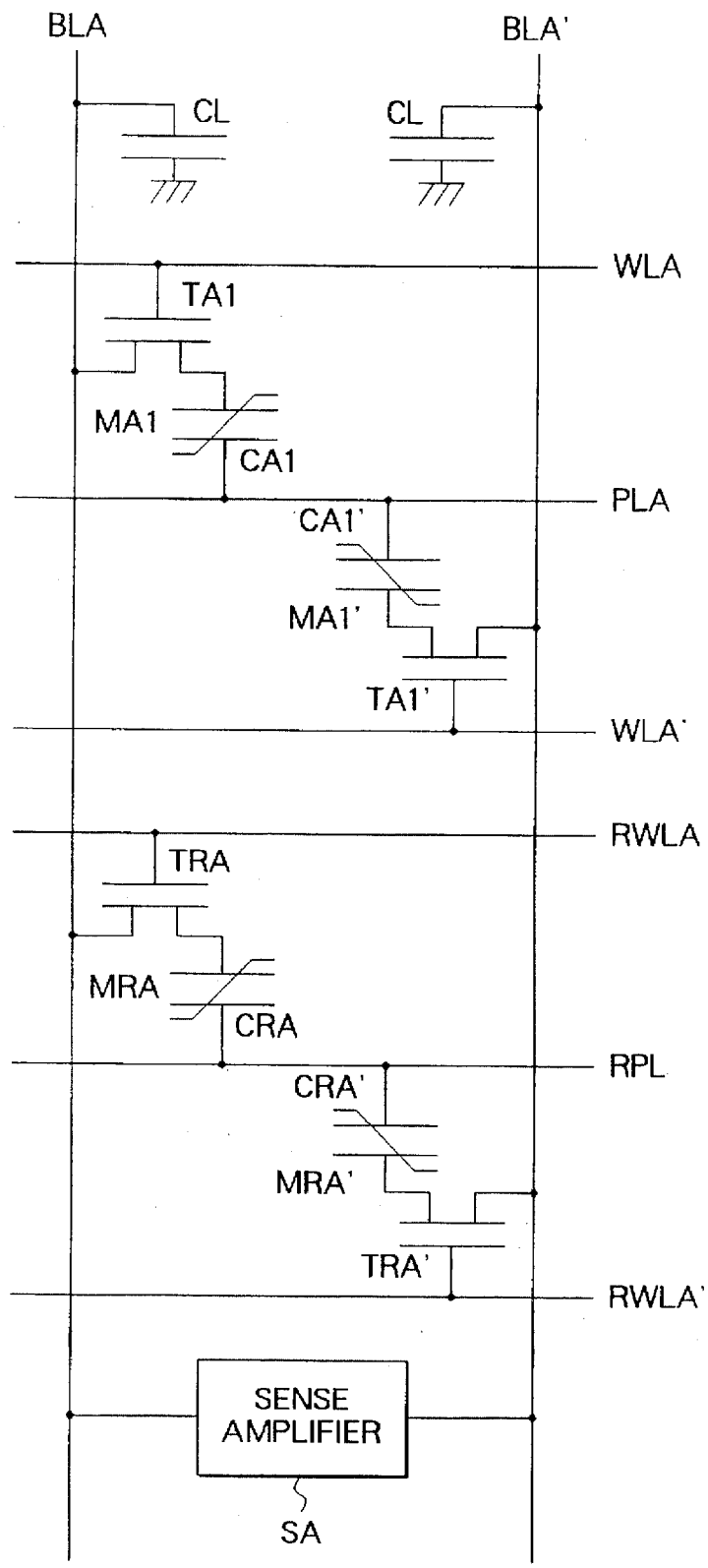
FIG. 4 is a view of the basic configuration of a memory array of a ferroelectric memory comprised by one-transistor, one-capacitor (1TR-1CAP) type cells.

Accordingly, in a 2TR-2CAP type cell, in the hysteresis characteristic of FIG. 1, a +Qr or −Qr residual polarization charge is read onto the bit lines BLA and BLA' and complementarily amplified by a sense amplifier SA during a data read operation. FIG. 4 is a circuit diagram of a memory array of a ferroelectric memory having 1TR-1CAP type cells.

The memory array of FIG. 4 forms a so-called folded bit line construction. In the figure, MA1 and MA1' denote memory cells, MRA and MRA' denote reference cells, WLA and WLA' denote word lines, BLA and BLA' denote bit lines, PLA denotes a plate line, RWLA and RWLA' denote word lines for driving the reference cells, RPLA denotes a plate line for driving the reference cells, and CL denotes a load capacitance of the bit lines BLA and BLA'.

The memory cell MA1 is comprised of the selection transistor TA1 and the ferroelectric capacitor CA1. The memory cell MA1' is comprised of the selection transistor TA1' and the ferroelectric capacitor CA1'.

The reference cells MRA and MRA' are provided for reading in comparison the data of the memory cells MA1 and MA1'. The reference cell MRA is comprised of the selection transistor TRA and the ferroelectric capacitor CRA, while the reference cell MRA' is comprised of the selection transistor TRA' and the ferroelectric capacitor CRA'.

In a ferroelectric memory having the 1TR-1CAP type cells of FIG. 4, the data of the memory cell MA1, for example, is read by a comparison with the reference cell MRA' connected to the reference bit line BLA' adjoining in the folded back direction of the read bit line BLA. The data of the memory cell MA1' is read by a comparison with the reference cell MRA adjoining in the folded back direction of the read bit line BLA'. In the reference cells MRA and MRA', further, in the hysteresis characteristic of FIG. 1, the capacitor area or the bias voltage and so forth are adjusted to give the optimal design to give an intermediate state in the case where the +Qr or −Qr residual polarization charge is read out.

Accordingly, in a 1TR-1CAP type cell, the difference in potential between the read bit line of the read cell and the reference bit line of the reference cell is amplified by the sense amplifier SA for a judgement as to the data.

FIRST EMBODIMENT

Figure 5:
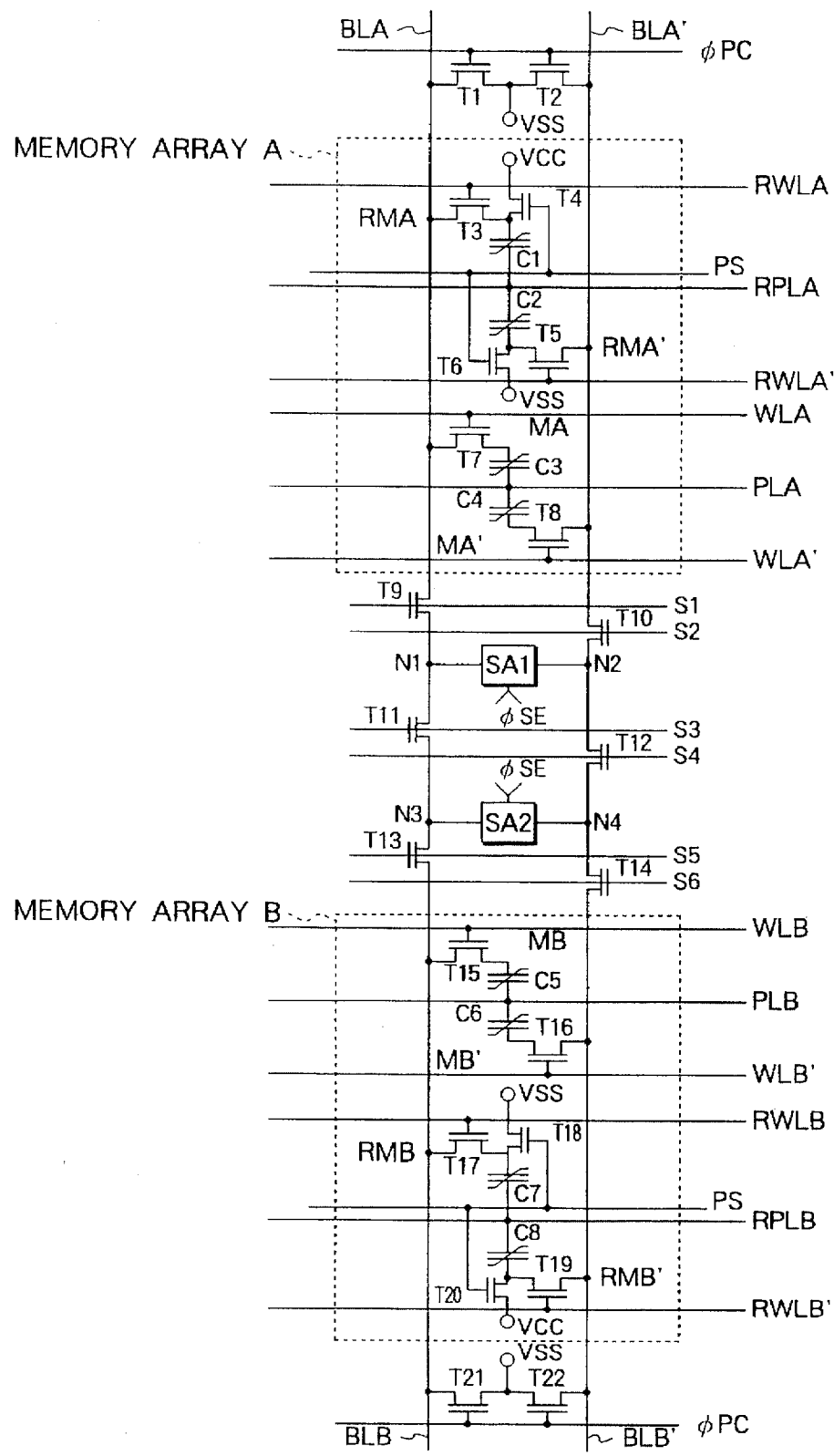
FIG. 5 is a circuit diagram of a first embodiment of the ferroelectric memory according to the present invention.
Figure 6:
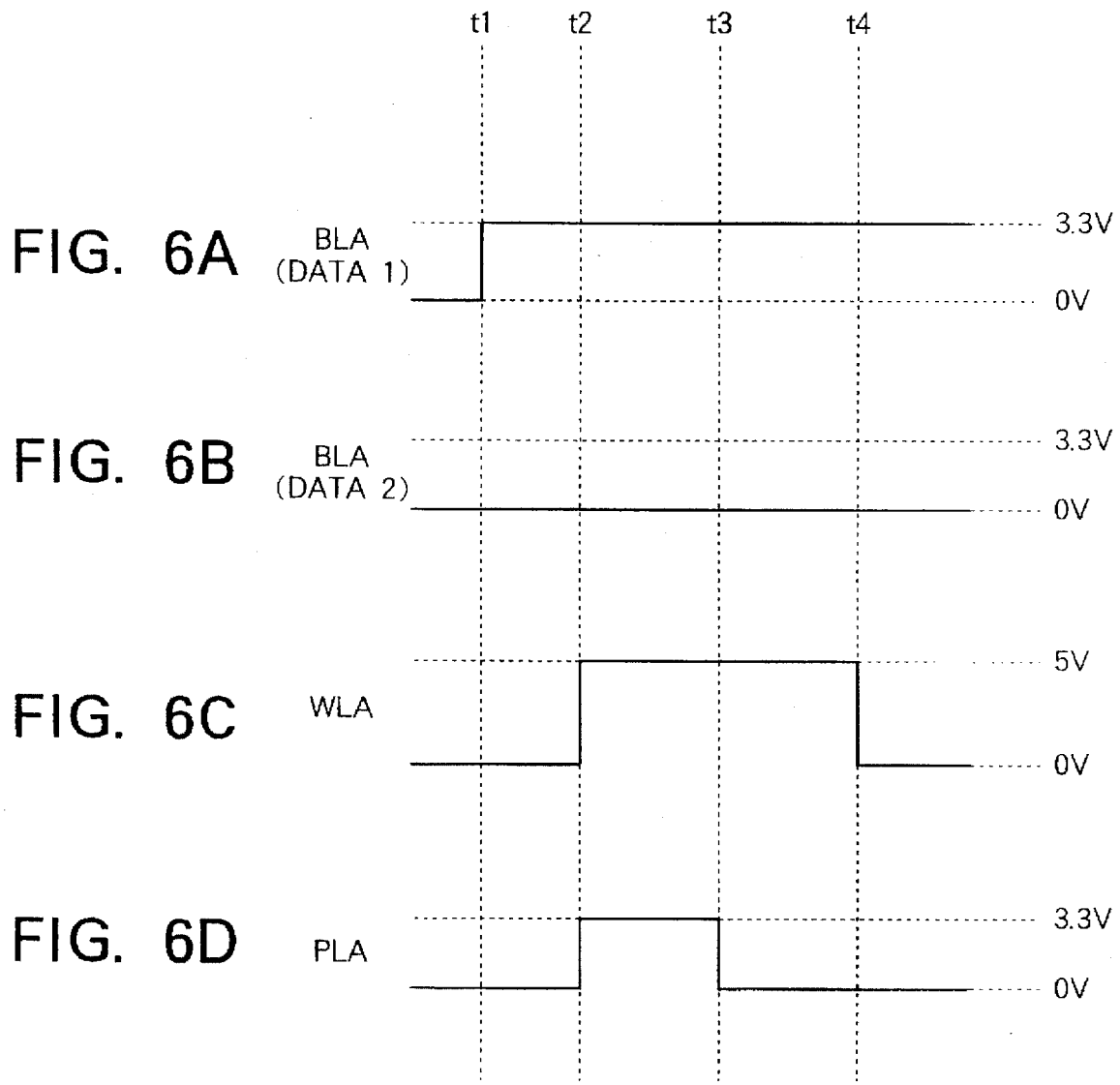
FIGS. 6A to 6D are timing charts for explaining a write operation in the first embodiment shown in FIG. 5.

FIG. 5 is a circuit diagram of a ferroelectric memory according to a first embodiment of the present invention, more specifically a ferroelectric memory having 1TR-1CAP type cells.

In FIG. 5, A and B represent memory arrays, T1, T2, T21, and T22 represent precharging transistors comprised of n-channel MOS (hereinafter referred to as "NMOS") transistors, T9 to T14 represent transfer gate transistors comprised of NMOS transistors, WLA, WLA', WLB, and WLB' represent word lines for driving the memory cells, RWLA, RWLA', RLWB, and RLWB' represent word lines for driving the reference cells, PLA and PLB represent plate lines for driving the memory cells, RPLA and RPLB represent plate lines for driving the reference cells, BLA, BLA', BLB, and BLB' represent bit lines, SA1 represents a first sense amplifier, and SA2 represents a second sense amplifier.

The memory arrays of FIG. 5, that is, the pair of memory array A and memory array B having a so-called folded bit line construction, are arranged in opposite directions across the first sense amplifier SA1 and the second sense amplifier SA2.

In the memory array A, the memory cell MA is comprised of a selection transistor T7 and a ferroelectric capacitor C3, while the memory cell MA' is comprised of a selection transistor T8 and a ferroelectric capacitor C4.

Further, reference cells RMA and RMA' are provided corresponding to the bit lines BLA and BLA'.

The reference cell RMA is comprised of a selection transistor T3, ferroelectric capacitor C1, and preset transistor T4 and is preset to the data 1 (first data) by connection of the ferroelectric capacitor C1 to the supply line of the power source voltage $V_{CC}$ by a preset signal PS.

The reference cell RMA' is comprised of a selection transistor T5, ferroelectric capacitor C2, and preset transistor T6 and is preset to the data 0 (second data) by connection of the ferroelectric capacitor C2 to the supply line of the ground voltage $V_{SS}$ by the preset signal PS.

In the memory array B, the memory cell MB is comprised of a selection transistor T15 and a ferroelectric capacitor C5, while the memory cell MB' is comprised of a selection transistor T16 and a ferroelectric capacitor C6.

Further, reference cells RMB and RMB' are provided corresponding to the bit lines BLB and BLB'.

The reference cell RMB is comprised of a selection transistor T17, ferroelectric capacitor C7, and preset transistor T18 and is preset to the data 0 (second data) by connection of the ferroelectric capacitor C7 to the supply line of the ground voltage $V_{SS}$ by the preset signal PS.

The reference cell RMB' is comprised of a selection transistor T19, ferroelectric capacitor C8, and preset transistor T20 and is preset to the data 1 (first data) by connection of the ferroelectric capacitor C8 to the supply line of the power source voltage $V_{CC}$ by the preset signal PS. The precharging transistors T1 and T2 become an on state and precharge the bit lines BLA and BLA' to the ground voltage $V_{SS}$ (0 V) when the precharging signal $\phi PC$ is the high level.

Similarly, the precharging transistors T21 and T22 become or an state and precharge the bit lines BLB and BLB' to the ground voltage $V_{SS}$ when the precharging signal $\phi PC$ is the high level.

Further, the first and second sense amplifiers SA1 and SA2 are activated by the sense enable signal $\phi SE$. N1, N2 and N3, N4 show input-output nodes of the first sense amplifier SA1 and the second sense amplifier SA2, respectively. The transistors T9, T10, T11, T12, T13, and T13 connect the input-output nodes N1 to N4 to the bit lines BLA, BLA, BLB, and BLB' by the selection signals S1, S2, S3, S4, S5, and S6. An explanation will be made of a write operation and a read operation on a memory cell in the first embodiment of FIG. 5.

FIGS. 6A to 6D are timing charts of the write operation on for example the memory cell MA in the first embodiment of FIG. 5.

First, the bit line BLA to which the memory cell MA is connected is precharged to the ground voltage $V_{SS}$ (0 V), then at the time t1, the bit line BLA is set to the power source voltage $V_{CC}$ (3.3 V) when the data to be written in the memory cell MA is the data 1 and is set to the ground voltage $V_{SS}$ (0 V) when the data to be stored in the memory cell MA is the data 0. Next, at the time t2, the word line WLA to which the memory cell MA is connected is raised from 0 V to 5 V and the plate electrode line PLA is raised from 0 V to 3.3 V. As a result, when the data to be written in the memory cell MA is the data 0, the ferroelectric capacitor C3 of the memory cell MA shifts to the state of the point D in the hysteresis characteristic of FIG. 1 before the time t3 to finish writing the data.

Next, at the time t3, the word line WLA is held at 5 V and the plate electrode line PLA is lowered from 3.3 V to 0 V. As a result, when the data to be written in the memory cell MA is the data 1, the ferroelectric capacitor C3 of the memory cell MA shifts to the state of the point C in the hysteresis characteristic of FIG. 1 before the time t4 to finish writing the data.

Finally, the word line WLA is lowered from 5 V to 0 V to end the write operation.

Figure 8:
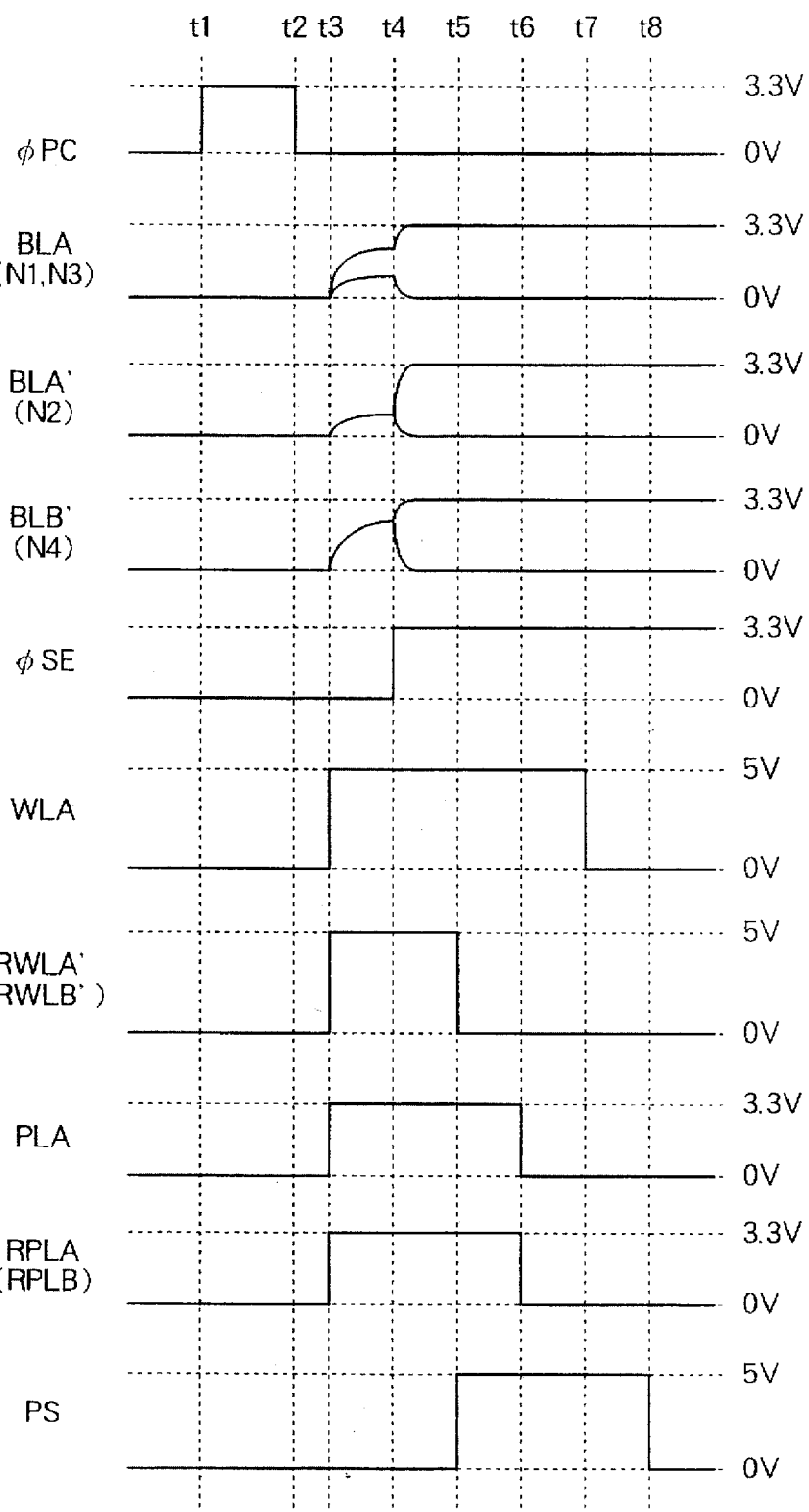
FIGS. 8A to 8J are timing charts for explaining a read operation in the first embodiment shown in FIG. 5.

An explanation will be made of the operation for reading a memory cell of FIG. 5 referring to FIG. 7, FIG. 8, and FIG. 9.

FIG. 7 is a view of which of the bit lines BLA, BLA', BLB, and BLB' are connected to the input-output nodes N1, N2 and N3, N4 of the first sense amplifier SA1 and the second sense amplifier SA2 under the control of the selection signals S1, S2, S3, S4, S5, and S6 in the case of reading the memory cells MA, MA', MB, and MB'.

When reading the memory cell MA, the bit line BLA to which the memory cell MA is connected is connected to the nodes N1 and N3, the bit line BLA' to which the reference cell RMA' is connected is connected to the node N2, and the bit line BLB' to which the reference cell RMB' is connected is connected to the node N4. As a result, the first sense amplifier SA1 performs the comparison and amplification between the data of the memory cell MA and the reference cell RMA' in which the data 0 is written, while the second sense amplifier SA2 performs the comparison and amplification between the data of the memory cell MA and the reference cell RMB' in which the data 1 is written.

Further, when reading the memory cell MA', the bit line BLA' to which the memory cell MA' is connected is connected to the nodes N2 and N4, the bit line BLA to which the reference cell RMA is connected is connected to the node N1, and the bit line BLB to which the reference cell RMB is connected is connected to the node N3. As a result, the first sense amplifier SA1 performs the comparison and amplification between the data of the memory cell MA' and the reference cell RMA in which the data 1 is written, while the second sense amplifier SA2 performs the comparison and amplification between the data of the memory cell MA' and the reference cell RMB in which the data 0 is written.

Furthermore, when reading the memory cell MB, the bit line BLB to which the memory cell MB is connected is connected to the nodes N1 and N3, the bit line BLA' to which the reference cell RMA' is connected is connected to the node N2, and the bit line BLB' to which the reference cell RMB' is connected is connected to the node N4. As a result, the first sense amplifier SA1 performs the comparison and amplification between the data of the memory cell MB and the reference cell RMA' in which the data 0 is written, while the second sense amplifier SA2 performs the comparison and amplification between the data of the memory cell MB and the reference cell RMB' in which the data 1 is written.

Further, when reading the memory cell MB', the bit line BLB' to which the memory cell MB' is connected is connected to the nodes N2 and N4, the bit line BLA to which the reference cell RMA is connected is connected to the node N1, and the bit line BLB to which the reference cell RMB is connected is connected to the node N3. As a result, the first sense amplifier SA1 performs the comparison and amplification between the data of the memory cell MB' and the reference cell RMA in which the data 1 is written, while the second sense amplifier SA2 performs the comparison and amplification between the data of the memory cell MB' and the reference cell RMB in which the data 0 is written.

FIGS. 8A to 8J are timing charts of the read operation on for example the memory cell MA in FIG. 5.

At the time t1, the precharging signal φPC is raised from 0 V to 3.3 V to precharge to 0 V the bit line BLA to which the memory cell MA is connected, the bit line BLA'to which the reference cell RMA' is connected, and the bit line BLB' to which the reference cell RMB' is connected.

At the time t2, the precharging signal φPC is lowered from 3.3 V to 0 V to end the initialization of the bit lines.

At the time t3, the word line WLA to which the memory cell MA is connected is raised from 0 V to 5 V and the plate electrode line PLA is raised from 0 V to 3.3 V.

The word Line RWLA' to which the reference cell RMA' is connected is raised from 0 V to 5 V and the plate electrode line RPLA is raised from 0 V to 3.3 V. The word line RWLB' to which the reference cell RMB' is connected is raised from 0 V to 5 V and the plate electrode line RPLB is raised from 0 V to 3.3 V. As a result, the potential of the bit line BLA changes in accordance with the reading of data of the memory cell MA, the potential of the bit line BLA' in accordance with the reading of data 0 of the reference cell RMA', and the potential of the bit line BLB' in accordance with the reading of data 1 of the reference cell RMB'.

In this case, when the read data is the data 1, the plus side polarization charge of the hysteresis characteristic of the memory cell MA of FIG. 5 is read, so changes to the higher voltage side, while when the read data is the data 0, the minus side polarization charge is read, so changes to the lower voltage side.

After the bit line potential sufficiently changes, the sense enable signal φSE is raised from 0 V to 3.3 V at the time t4 so as to activate the first sense amplifier SA1 and the second sense amplifier SA2. As a result, the first sense amplifier SA1 performs the comparison and amplification between the data of the memory cell MA and the data 0 of the reference cell RMA', while the second sense amplifier SA2 performs the comparison and amplification between the data of the memory cell MA and the data 1 of the reference cell RMB'.

The comparison and amplification abilities of the sense amplifiers are proportional to the difference in potential between bit lines (difference in potential between nodes), so the bit line potentials are amplified and latched by the results of comparison and amplification of the sense amplifier of the side where the data of the memory cell MA becomes opposite to the data of the reference cell connected. Accordingly, the data of the memory cell MA is latched.

At the time t5, the word line RWLA' to which the reference cell RMA' is connected and the word line RWLB' to which the reference cell RMB' is connected are lowered from 5 V to 0 V and the preset signal PS is lowered to 0 V.

As a result, the reference cell RMA' shifts to the state of the point D in the hysteresis characteristic of FIG. 1 before the time t6 where the plate line RPLA falls, so the data 0 is rewritten.

Next, at the time t6, the plate line PLA to which the memory cell MA is connected is lowered from 3.3 V to 0 V.

As a result, the memory cell MA shifts to the state of the point C in the hysteresis characteristic of FIG. 1 in the case of the data 1 and to the state of the point B in the case of the data 0 before the time t7 where the word line WLA falls, so the data is rewritten in the memory cell MA.

Further, similarly, at the time t6, the plate line RPLB to which the reference cell RMB' is connected is lowered from 3.3 V to 0 V.

As a result, the reference cell RMB' shifts to the state of the point D in the hysteresis characteristic of FIG. 1 before the time t8 where the preset signal PS falls, so the data 1 is rewritten.

At the time t8, the preset signal PS is lowered from 5 V to 0 V and the read operation is ended.

Figure 9:
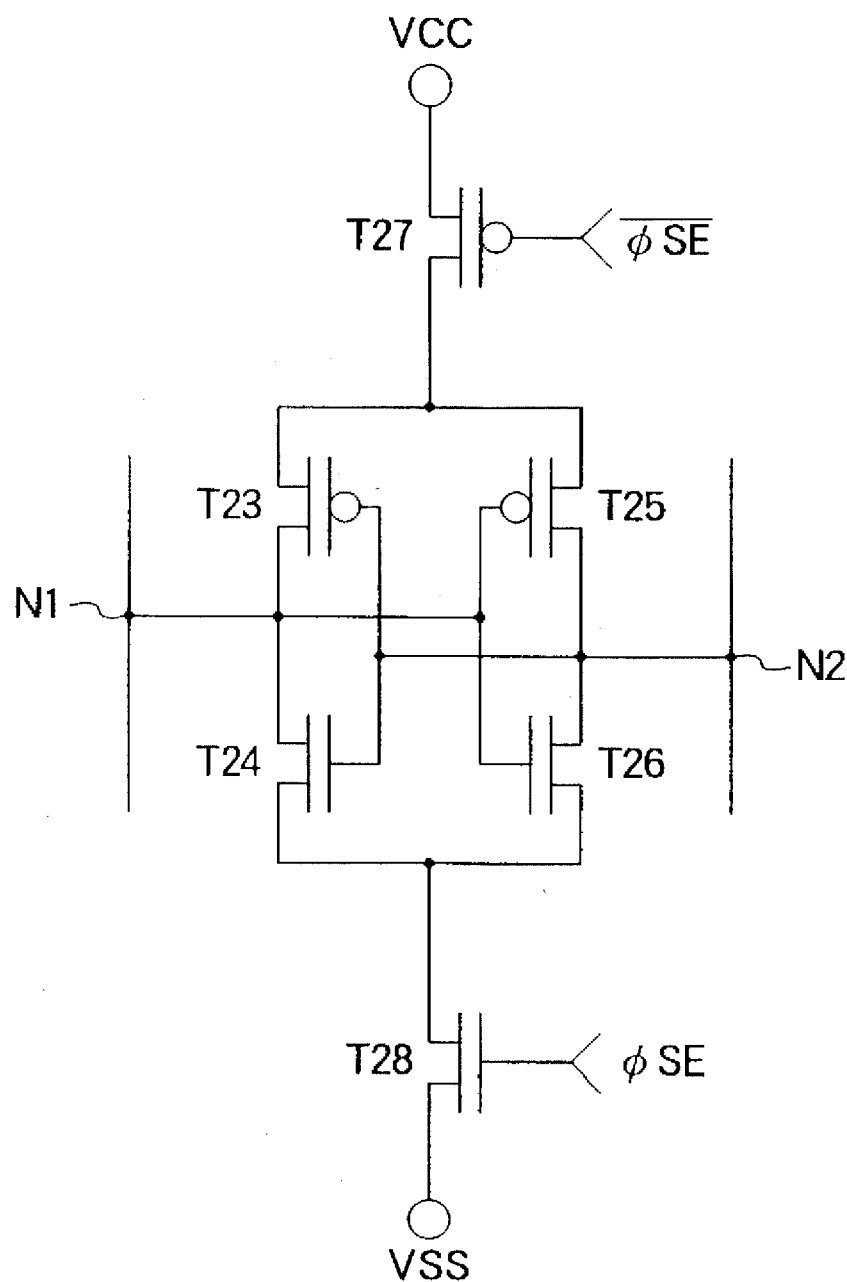
FIG. 9 is another circuit diagram of a ferroelectric memory according to the first embodiment of the present invention.

FIG. 9 is a circuit diagram of a concrete example of the first sense amplifier SA1 in FIG. 5. Naturally, the second sense amplifier SA2 has a similar circuit configuration.

In the sense amplifier of FIG. 9, a latch circuit is formed by a p-channel MOS (hereinafter referred to as a "PMOS") transistor T23, NMOS transistor T24, and complementary inverter circuit comprised of a PMOS transistor T25 and an NMOS transistor T26. This latch circuit amplifies and latches the difference in potential between the nodes N1 and N2 by the activation of the PMOS transistor T27 and NMOS transistor T28 activated by the sense enable signal φSE.

As explained above, according to the first embodiment of the present invention, in a ferroelectric memory of 1TR-1CAP type cells for example, when reading data, the read cell is read in comparison simultaneously and in parallel with the data of the first reference cell and the data of the second reference cell in which data of different values from each other are stored.

Therefore, the data of the read cell becomes different from one of the data of the first reference cell or the data of the second reference cell. The comparison and amplification are performed by one of the first sense amplifier or second sense amplifier with the reference cell with the different value by a difference in potential between bit lines similar to a 2TR-2CAP type cell. As a result, a sufficient margin for a read operation can be secured and in turn a higher reliability and greater capacity can be realized.

SECOND EMBODIMENT

Figure 10:
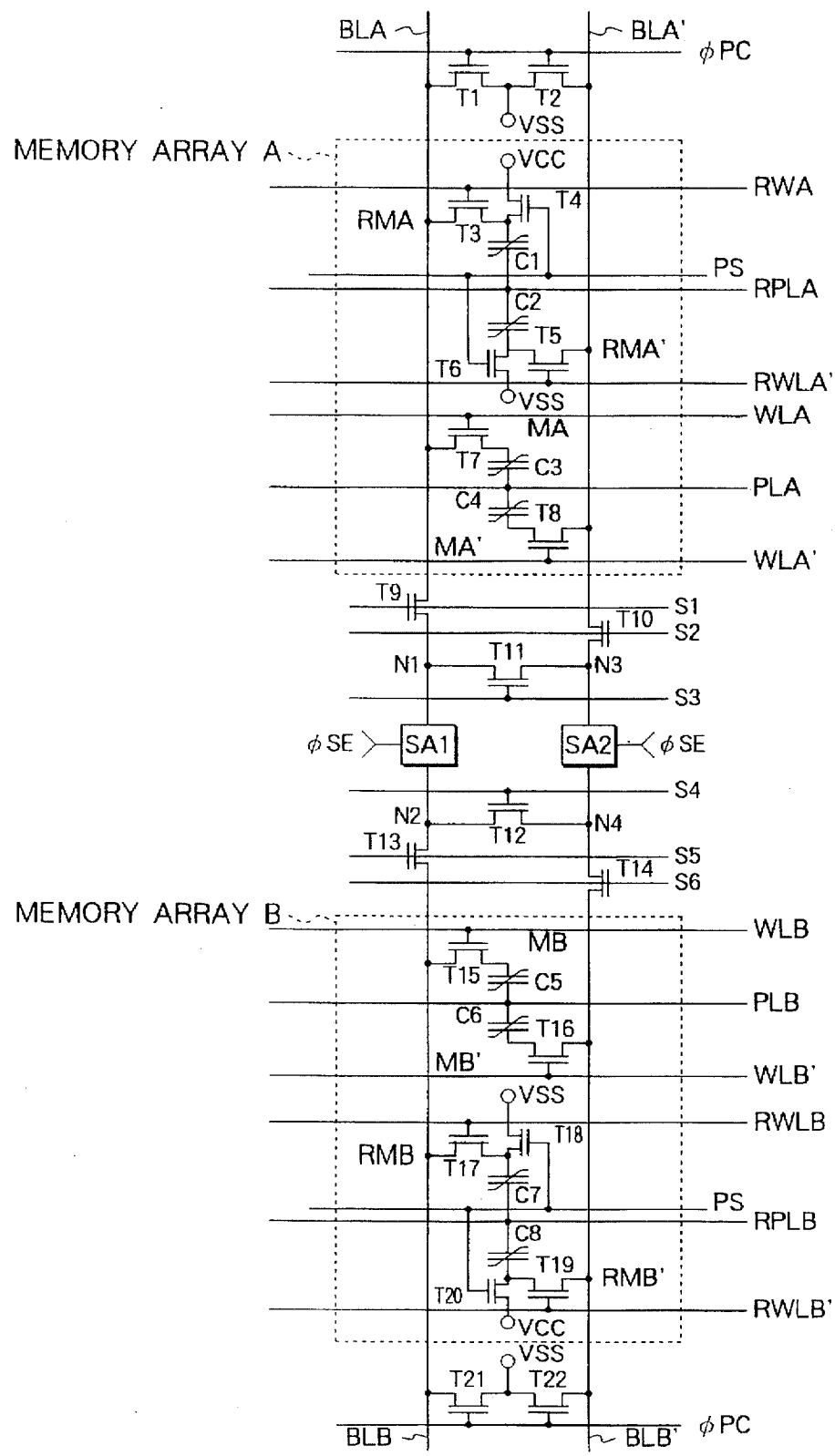
FIG. 10 is a circuit diagram of a ferroelectric memory according to a second embodiment of the present invention.

FIG. 10 is a circuit diagram of a ferroelectric memory according to a second embodiment of the present invention, more particularly, a ferroelectric memory having 1TR-1CAP type cells.

The memory arrays Of FIG. 10, like in the first embodiment of FIG. 5, are comprised of the pair of memory array A and memory array B of so-called folded bit line constructions arranged in opposite directions across the first sense amplifier SA1 and the second sense amplifier SA2.

The circuit of FIG. 10 differs from the circuit of FIG. 5 in the point that both the first reference cell and the second reference cell are read from the memory array opposite to the memory array of the selected read cell. Therefore, the arrangement of the transistors T9, T10, T11, T12, T13, and T14 and the selection signals S1, S2, S3, S4, S5, and S6 for connecting the input-output nodes N1, N2 and N3, N4 of the first sense amplifier SA1 and second sense amplifier SA2 to the bit lines BLA, BLA', BLB, and BLB'differs from FIG. 5.

Specifically, the first sense amplifier SA1 is connected between the transistor T9 connected to the bit line BLA and the transistor T13 connected to the bit line BLB, while the second sense amplifier SA2 is connected between the transistor T10 connected to the bit line BLA' and the transistor T14 connected to the bit line BLB'.

The transistor T11 is connected between the node N1 of the first sense amplifier SA1 and the transistor T9 and the node N3 of the transistor T10 and the second sense amplifier SA2. The transistor T12 is connected between the node N2 of the first sense amplifier SA1 and the transistor T13 and the node N4 of the second sense amplifier SA2 and the transistor T14.

In the second embodiment of FIG. 10, the write operation on the memory cell is the same as in the case of the first embodiment of FIG. 5.

An explanation will be made of the operation for reading a memory cell in the second embodiment of FIG. 10 referring to FIG. 11 and FIGS. 12A to 12J.

FIG. 11 is a view of which of the bit lines BLA, BLA', BLB, and BLB' are connected to the input-output nodes N1, N2 and N3, N4 of the first sense amplifier SA1 and the second sense amplifier SA2 under the control of the selection signals S1, S2, S3, S4, S5, and S6 in the case of reading the memory cells MA, MA', MB, and MB'.

When reading the memory cell MA, the bit line BLA to which the memory cell MA is connected is connected to the nodes N1 and N3, the bit line BLB to which the reference cell RMB is connected is connected to the node N2, and the bit line BLB' to which the reference cell RMB' is connected is connected to the node N4. As a result, the first sense amplifier SA1 performs the comparison and amplification between the data of the memory cell MA and the reference cell RMB in which the data 0 is written, while the second sense amplifier SA2 performs the comparison and amplification between the data of the memory cell MA and the reference cell RMB' in which the data 1 is written.

When reading the memory cell MA', the bit line BLA' to which the memory cell MA' is connected is connected to the nodes N1 and N3, the bit line BLB to which the reference cell RMB is connected is connected to the node N2, and the bit line BLB' to which the reference cell RMB' is connected is connected to the node N4. As a result, the first sense amplifier SA1 performs the comparison and amplification between the data of the memory cell MA' and the reference cell RMB in which the data 0 is written, while the second sense amplifier SA2 performs the comparison and amplification between the data of the memory cell MA' and the reference cell RMB' in which the data 1 is written.

When reading the memory cell MB, the bit line BLB to which the memory cell MB is connected is connected to the nodes N2 and N4, the bit line BLA to which the reference cell RMA is connected is connected to the node N1, and the bit line BLA' to which the reference cell RMA' is connected is connected to the node N3. As a result, the first sense amplifier SA1 performs the comparison and amplification between the data of the memory cell MB and the reference cell RMA in which the data 1 is written, while the second sense amplifier SA2 performs the comparison and amplification between the data of the memory cell MB and the reference cell RMA' in which the data 0 is written.

When reading the memory cell MB', the bit line BLB' to which the memory cell MB' is connected is connected to the nodes N2 and N4, the bit line BLA to which the reference cell RMA is connected is connected to the node N1, and the bit line BLA' to which the reference cell RMA' is connected is connected to the node N3. As a result, the first sense amplifier SA1 performs the comparison and amplification between the data of the memory cell MB' and the reference cell RMA in which the data 1 is written, while the second sense amplifier SA2 performs the comparison and amplification between the data of the memory cell MB' and the reference cell RMA' in which the data 0 is written.

FIGS. 12A to 12J are timing charts of the read operation on for example the memory cell MA in the second embodiment of FIG. 10.

The timing charts of FIGS. 12A to 12J are basically the same as those of FIGS. 8A to 8J. The difference is that in the case of the first embodiment of FIG. 5, the first reference cell and the second reference cell were RMA' and RMB', while in the case of the second embodiment, the first reference cell and the second reference cell are RMB and RMB'.

As explained above, according to the second embodiment of the present invention, in a ferroelectric memory of 1TR-1CAP type cells for example, when reading data, the read cell is read in comparison simultaneously and in parallel with the data of the first reference cell and the data of the second reference cell in which data of different values from each other are stored.

Therefore, the data of the read cell becomes different from one of the data of the first reference cell or the data of the second reference cell and the comparison and amplification are performed by one of the first sense amplifier or second sense amplifier with the reference cell with the different value by a difference in potential between bit lines similar to 2TR-2CAP type cells. As a result, a sufficient margin for a read operation can be secured and in turn a higher reliability and greater capacity can be realized.

Note that in the above embodiments, the explanation was made with reference to operation as a nonvolatile ferroelectric memory, but the invention is not limited to this. For example, it is also possible to add a DRAM operating mode in addition to the so-called ferroelectric mode explained above, selectively switch between the ferroelectric mode and the DRAM mode, and, in the DRAM mode, judge the data in accordance with the charge accumulation of the ferroelectric capacitor constituting part of the memory cell.

In this case, for example, the data is judged by using the hysteresis between the point D and the point B in the figure in the hysteresis characteristic shown in FIG. 1.

Various modifications are possible in this case, for example, writing the data in the ferroelectric mode, then operating in the DRAM mode or sometimes writing data in the ferroelectric mode.

By use of this DRAM mode, it is possible to suppress deterioration of the ferroelectric capacitor.

As explained above, the present invention provides a ferroelectric memory comprised of a word line; a read bit line; a plate line; a memory array comprised of a matrix arrangement of memory cells with gate electrodes connected to the word line, one of the source-drain electrodes connected to the read bit line, the other of the source-drain electrodes connected to one of the electrodes of a ferroelectric capacitor, and the other of the electrodes of the ferroelectric capacitor connected to the plate line; a first reference cell and a second reference cell corresponding to each of the read cells in a word line selected at the time of reading data, read out in comparison with each other, and storing data different in value from each other; a first sense amplifier for comparing and amplifying a difference in potential between the read bit line and a first reference bit line to which the first reference cell is connected for each read bit line to which a read cell is connected; and a second sense amplifier for comparing and amplifying a difference in potential between the read bit line and a second reference bit line to which the second reference cell is connected.

According to this, in the case for example of a ferroelectric memory of 1TR-1CAP type cells wherein a memory cell is comprised of a single selection transistor and a single ferroelectric capacitor, when reading the data, the read cell is read out in comparison simultaneously and in parallel with the data of the first reference cell and the data of the second reference cell in which data of different values are stored. As a result, the data of the read cell becomes different from one of the data of the first reference cell or the data of the second reference cell and a comparison and amplification are performed with the reference cell with the different value by a difference of bit line potential like that of 2TR-2CAP type cells by one of the first sense amplifier or second sense amplifier.

Further, the ferroelectric memory may have a pair of memory arrays of folded bit line constructions in which one of the first or second reference cells are provided corresponding to the bit lines. The pair of memory arrays may be arranged in opposite directions across the first sense amplifier and the second sense amplifier. When reading the data, one of the pair of memory arrays may be selected.

For example, the read bit line may be the bit line to which the read cell of the selected memory array is connected, the first reference bit line and the first reference cell may be the bit line adjoining the read bit line in the folded back direction and the reference cell connected to that bit line, and the second reference bit line and second reference cell may be the bit line arranged opposite to the direction in which the first reference bit line extends and the reference cell connected to that bit line in the non-selected memory array.

Alternatively, the read bit line may be the bit line to which the read cell of the selected memory array is connected, the first reference bit line and the first reference cell may be the bit line arranged opposite to the direction in which the read bit line extends and the reference cell connected to that bit line in the non-selected memory array, and the second reference bit line and second reference cell may be the bit line adjoining the first reference bit line in the folded back direction and the reference cell connected to that bit line.

By making the first sense amplifier and the second sense amplifier latch type sense amplifiers, it is possible to have the sense amplifier with the larger difference in potential between bit lines perform the comparison and amplification.

Further, the first reference cell and the second reference cell are connected to a predetermined first potential or second potential before reading the data by a connecting means for connecting the nodes of the ferroelectric capacitors and selection transistors of the 1TR-1CAP type cells like that of a normal memory cell to the predetermined potentials.

What is claimed is:

1. A ferroelectric memory comprising:

a word line;

a read bit line;

a plate line;

a memory array including a matrix arrangement of memory cells with gate electrodes connected to the word line, one of source-drain electrodes connected to the read bit line, the other of source-drain electrodes connected to one of electrodes of a ferroelectric capacitor, and the other of electrodes of the ferroelectric capacitor connected to the plate line;

a first reference cell and a second reference cell corresponding to each of the read cells in a word line selected at the time of reading data, read out in comparison with each other, and storing data different in value from each other;

a first sense amplifier for comparing and amplifying a difference in potential between the read bit line and a first reference bit line to which the first reference cell is connected for each read bit line to which a read cell is connected; and a second sense amplifier for comparing and amplifying a difference in potential between the read bit line and a second reference bit line to which the second reference cell is connected.

2. A ferroelectric memory as set forth in claim 1, wherein, at the time of reading data, simultaneously and in parallel reading is carried out for the data of the read cell to the read bit line, the data of the first reference cell to the first reference bit line, and the data of the second reference cell to the second reference bit line, in which the data of the read cell is read as a result of the comparison and amplification of the first sense amplifier when the data of the read cell is different from the data of the first reference cell and the same as the data of the second reference cell, and in which the data of the read cell is read as a result of the comparison and amplification of the second sense amplifier when the data of the read cell is the same as the data of the first reference cell and different from the data of the second reference cell.

3. A ferroelectric memory as set forth in claim 1, comprising a pair of memory arrays forming folded bit line constructions provided with one of the first or second reference cells for each bit line, wherein the pair of memory arrays being arranged in opposite directions across the first sense amplifier and the second sense amplifier and, at the time of reading data, one of the memory arrays of the pair of memory arrays being selected for reading the data of the read cell.

4. A ferroelectric memory as set forth in claim 1, wherein the read bit line is the bit line to which the read cell of the selected memory array is connected, p1 the first reference bit line and the first reference cell are the bit line adjoining the read bit line in the folded back direction and the reference cell connected to that bit line, and the second reference bit line and second reference cell are the bit line arranged opposite to the direction in which the first reference bit line extends and the reference cell connected to that bit line in the non-selected memory array.

5. A ferroelectric memory as set forth in claim 1, wherein the read bit line is the bit line to which the read cell of the selected memory array is connected, the first reference bit line and the first reference cell are the bit line arranged opposite to the direction in which the read bit line extends and the reference cell connected to that bit line in the non-selected memory array, and the second reference bit line and second reference cell are the bit line adjoining the first reference bit line in the folded back direction and the reference cell connected to that bit line.

6. A ferroelectric memory as set forth in claim 1, wherein the first sense amplifier and the second sense amplifier are latch type sense amplifiers which compare and amplify the difference in potential between the read bit line and the first reference bit line or the second reference bit line.

7. A ferroelectric memory as set forth in claim 1, wherein the first reference cell and the second reference cell each have one selection transistor connected to the word line and bit line, one ferroelectric capacitor with one electrode connected to the selection transistor, and a connecting means for connecting the node between the ferroelectric capacitor and the selection transistor to a predetermined first potential or second potential.

8. A ferroelectric memory as set forth in claim 1, wherein, before the data is read, the first reference cell is connected to the first potential to write the desired data in the first reference cell and the second reference cell is connected to the second potential to write the desired data in the second reference cell.

9. A ferroelectric memory as set forth in claim 1, wherein the memory cell and the reference cell are the same in size.

10. A ferroelectric memory as set forth in claim 1, which can operate selectively in either of the DRAM mode or the ferroelectric mode and, in the DRAM mode, the data is judged in accordance with the charge accumulation of the ferroelectric capacitor of the memory cell.

* * * * *